United States Patent [19]

Rose

[11] Patent Number: 4,961,893
[45] Date of Patent: Oct. 9, 1990

[54] METHOD FOR MANUFACTURING MEMORY CARDS

[75] Inventor: Renë Rose, Voisin le Bretonneux, France

[73] Assignee: Schlumberger Industries, Montrouge, France

[21] Appl. No.: 341,182

[22] Filed: Apr. 21, 1989

[30] Foreign Application Priority Data

Apr. 28, 1988 [FR] France ................. 88 05671
Sep. 16, 1988 [FR] France ................. 88 12088

[51] Int. Cl.⁵ .......................................... B29C 45/14
[52] U.S. Cl. ................... 264/247; 264/261; 264/272.15; 264/272.17; 264/278
[58] Field of Search .............. 264/261, 272.11, 272.17, 264/272.15, 275, 247, 276, 255, 277, 250, 278, 279, 279.1; 235/492, 493; 425/517

[56] References Cited

U.S. PATENT DOCUMENTS

| | | | |
|---|---|---|---|
| 3,122,598 | 2/1964 | Berger | 264/247 |
| 3,469,310 | 9/1969 | Peck | 264/272.11 |
| 3,654,062 | 4/1972 | Loew | 264/247 |
| 3,839,129 | 10/1974 | Neumann | 264/247 |
| 4,216,577 | 8/1980 | Badet | 264/272.17 |
| 4,427,615 | 1/1984 | Eskesen | 264/278 |
| 4,450,024 | 5/1984 | Haghiri-Tehrani | 264/272.17 |
| 4,625,102 | 11/1986 | Rebjock | 425/517 |
| 4,737,620 | 4/1988 | Mollet | 235/492 |
| 4,779,145 | 10/1988 | Lemelson | 235/493 |
| 4,801,561 | 1/1989 | Sankhagowit | 264/272.11 |
| 4,812,633 | 3/1989 | Vogelgesang | 235/493 |
| 4,822,550 | 4/1989 | Komathu | 264/272.15 |

FOREIGN PATENT DOCUMENTS 1186003 4/1985 Canada ................. 235/493

Primary Examiner—Jay H. Woo
Assistant Examiner—Jeremiah F. Durkin, II
Attorney, Agent, or Firm—Frishauf, Holtz, Goodman & Woodward

[57] ABSTRACT

A support element supports the integrated circuit chip of an electronic memory card. The support element is used for positioning the chip inside a mold cavity and the card body is formed by injecting plastic material (e.g., ABS) into the cavity so that the chip is embedded in the plastic. The support element may be constituted of a film which is peeled off the finished card or it may be constituted of a sheet which remains as an integral part of the card. The support element may include graphics elements for decorating the card face. If the support element is a peel-off film, then the graphics elements are transferred and remain visible on the card. If the support element remains as an integral part of the card, then the graphics elements are formed on a face thereof which is visible in the finished card.

7 Claims, 3 Drawing Sheets

METHOD FOR MANUFACTURING MEMORY CARDS

The present invention relates to a method of manufacturing memory cards, in particular electronic memory cards, and to cards obtained by implementing the said method.

BACKGROUND OF THE INVENTION

Memory cards essentially comprise a memory module and a card body which is generally made of a plastic material. Electronic memory cards have a memory module in the form of an electronics module essentially constituted by a semiconductor chip having an integrated circuit formed therein and a piece of printed circuit on which the chip is fixed and which also defines external electrical contact tabs. The electronics module is fixed in the card body in such a manner as to ensure that the electrical contact tabs lie flush with one of the main faces of the card body.

The card body is in the form of a rectangular parallelpiped which must be less than 1 mm thick and which is as defined by international standard ISO 7810. The edges of the card body are used as a reference for positioning the card in a card reader so that the contact tabs on the card come into electrical contact with a connector in the card reader.

It should be added that the card body also satisfies other specifications relating to the quality of its surface state and to well-defined bending behaviour: in torsion; in the longitudinal direction of the card body; and in the transverse direction. These specifications are defined by the above-specified ISO standard. In addition, the card body must not encourage electrostatic charge retention.

In order to solve this problem, French patent application number 8700446, published on July 22, 1988 has already proposed manufacturing a card by an injection molding method comprising the following stages:
- a memory module is provided having an access face and at least one anchor element;
- said module is placed in a mold and it is held in place in such a manner as to dispose the access face of the memory module against one of the walls of the mold;
- a plastic material is inserted into the mold in such a manner as to cause the entire volume delimited by the walls of the mold and not occupied by said memory module to be occupied by the plastic material; and
- the part made in this way is then unmolded.

Another problem which arises in manufacturing memory cards is providing graphics elements as generally required on at least one of the main faces of the card body, said graphics elements being constituted, for example, by alphanumeric information or by drawings for decorative purposes.

When the graphics element is quite complicated either because of the shape of its outline or else because of the shades of color to be obtained, the stage during which the pattern is printed e.g. by silkscreen printing or by offset printing can lead to failure, particularly if very strict quality standards are required concerning the outline and the colors. In the event of failure, cards having printing which is not up to standard must be rejected. This entails a loss of manufacturing costs involving raw materials, components, and manufacturing operations up to and including the stage during which the unacceptable printing is performed. These costs are particularly high if the pattern is made after the electronics module has already been implanted in the card body. This situation applies particularly, but not exclusively, to the case where a card is manufactured by molding the card body directly over the electronics module using the technique described in above-mentioned French patent application number 8700446.

In order to remedy these drawbacks, an object of the invention is to provide a method of manufacturing a card, in particular a memory card, in which the stage during which the pattern is provided on the card body cannot of itself give rise to a card being rejected.

An object of the invention is to provide a way of manufacturing a memory card, in particular an electronics memory card, in which the card body is molded over the memory module, but in which graphics elements can be provided on the card body, if so desired, under economic conditions which are particularly advantageous.

SUMMARY OF THE INVENTION

In order to achieve this object, the present invention provides a method of manufacturing a memory card comprising a card body having first and second mutually parallel main faces and a memory module including an access face disposed in said first main face of the card body, the method comprising the following steps:
- providing a mold whose mold cavity defines the outside shape of said card;
- providing a support element;
- providing a memory module having an access face;
- fixing the access face of said memory module to one of the faces of the support element;
- placing said support element in said mold in such a manner as to ensure that its periphery is fixed to said mold;
- injecting a plastic material into said mold so that the plastic material fills said mold cavity and so that said memory module is embedded in the plastic material; and
- unmolding the part obtained in this way and separating the support element from said part, thereby causing said memory module to be inserted in the card body with said access face of the memory module being disposed in said first main face of the card body.

In a preferred implementation of the method suitable for simultaneously providing graphics elements on the first main face of the card body, the support element includes print elements on its face on which the memory module is fixed, and when the plastic material is injected into the mold said print elements adhere to the face of the volume of injected material which comes into contact with the support element, thereby obtaining a memory card which also includes graphics elements on the first main face of the card body.

BRIEF DESCRIPTION OF THE DRAWINGS

Implementations of the invention are described by way of example with reference to the accompanying drawings, in which.

DETAILED DESCRIPTION

Figure 1:
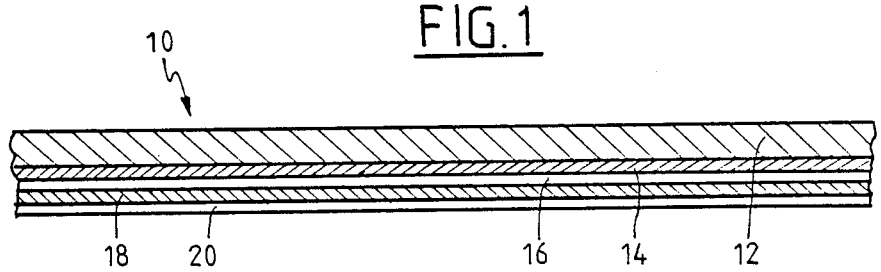
FIG. 1 is a section view through a print support element suitable for use in the invention.

Before explaining the invention as a whole in greater detail, a support element is described with reference to FIG. 1, said element being suitable, in addition, for providing the desired patterns.

The support element, given overall reference 10, includes a support 12 of plastic material. The support 12 is preferably made of polyester and is about 25 micrometers ($\mu$m) thick. The support 12 acts as a mechanical support and print elements for subsequent use in obtaining a desired pattern are formed thereon. Each print element includes a separation layer 14, a decorative layer 16 constituted by pigments, an optional layer of varnish 18, and a layer of adhesive 20 which is about 1 $\mu$m to 2 $\mu$m thick.

A large number of identical patterns may be provided on a single support sheet 12. One such product may be obtained, in particular, from the German firm Leonard Kurz GmbH.

A first method of manufacturing electronics memory cards in accordance with the invention is now described with reference to FIGS. 2 and 3.

The starting material is a support element 10 which has a plurality of identical patterns thereon, with each pattern corresponding to the entire pattern required on one of the faces of a card body. FIG. 2 shows two such patterns A and B. Each pattern is separated from adjacent patterns by empty spaces for a purpose explained below.

Figure 4:
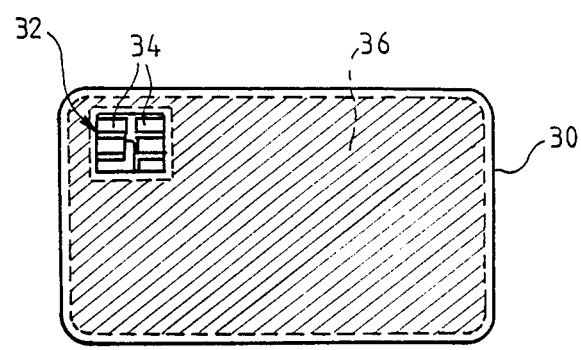
FIG. 4 is a plan view of an electronics memory card.

FIG. 4 shows a card body 30 made in accordance with the invention. In the main face of the card body which is visible, there can be seen the electronics module 32, made visible solely by its external electrical contact tabs 34. The zones of the card body which may be patterned are referenced 36. The zone 36 does not cover that portion of the face of the card body 30 which is occupied by the external electrical contact tabs 34.

Returning to FIG. 2, it is seen that each printed zone 36 leaves a bare portion 38 of the plastic support 12 where the electronics module 32 is to be located when the card is terminated.

The electronics module 32 comprises a lead frame or a piece of printed circuit having the external tabs 34 formed thereon, a semiconductor chip 40 fixed to the print circuit or to the lead frame, conductor wires 42 interconnecting the terminals of the chip 42 and to the contact tabs 34, and a covering material 44 in which the chip 40 and the wires 42 are embedded. A module 32 is glued to the support 12 at each location 38 such that each car-sized pattern includes one module.

Figure 2:
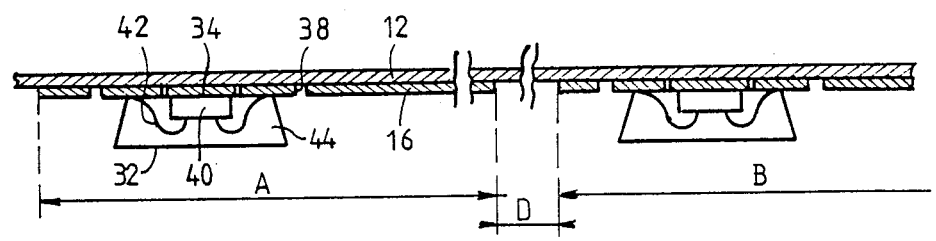
FIG. 2 is a section view through a support element provided with electronics modules.
Figure 3:
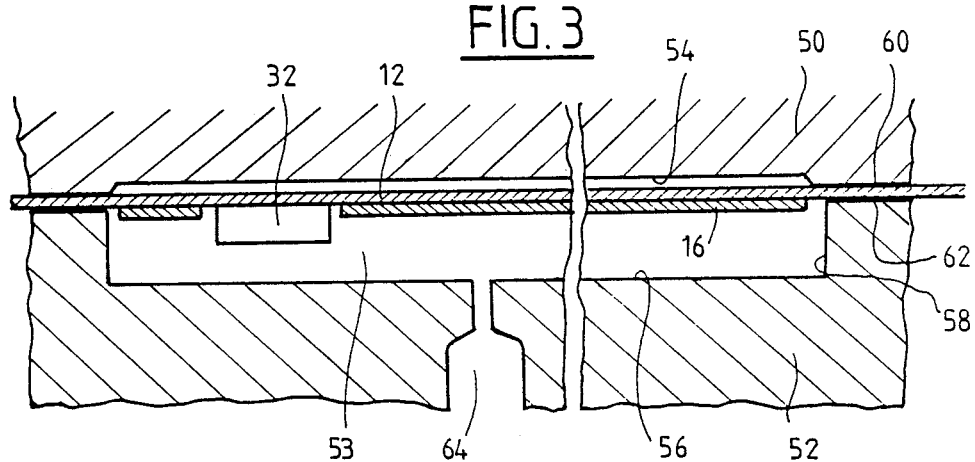
FIG. 3 is a vertical section through a first type of mold for manufacturing an electronics memory card.

As can be seen in FIG. 2, the outside faces of the external contact tabs are glued directly to the support 12.

This provides a strip constituted by the support 12 having a plurality of card-sized patterns (A, B, ...) on one of its faces, with each pattern also including an electronics module 32.

In the next stage the card body is made by injection molding plastic material, which material is preferably ABS. FIG. 3 shows the mold used. It comprises a fixed portion 50 and a moving portion 52. These two portions define a mold cavity 53 which determines the outside face of the card body. The fixed portion 50 has an inside wall 54 defining one of the main faces of the card body. The moving portion 52 has an inside wall 56 defining the second main face of the card body and an inside wall 58 defining the edge of the card body. The fixed and moving portions 50 and 52 include respective bearing surfaces 60 and 62 and these two bearing surfaces normally make contact with each other when the mold is closed.

While the mold is open, the strip formed on the support 12 is placed between the fixed portion 50 and the moving portion 52 of the mold. The strip is positioned relative to the mold cavity 53 in such a manner that the pattern 16 carried by the support 12, and consequently the electronics module 32 also carried thereby is accurately positioned relative to the side wall 58 of the mold cavity, i.e. relative to the edge of the card body which is about to be made. The mold is then closed. The support 12 is clamped between the bearing surfaces 60 and 62 of the two mold portions in the zone D of the support 12 surrounding a card-sized pattern. Thereafter plastic material is injected into the mold cavity 53 via an injection nozzle 64, and preferably ABS is injected at a temperature lying in the range 220° C. to 280° C. Preferably, the nozzle 62 is disposed in the middle of the wall 56 of the moving portion 52. The plastic material fills the mold cavity 53 and thrusts the support 12 against the inside wall 54 of the mold. The plastic material surrounds the electronics module 32 except for its face which is glued on the support 12, and the plastic material also comes into contact with the pattern 16. Under the effects of pressure and temperature, the decorative elements 16 are fixed to the corresponding face of the volume of plastic material and tend to separate from the support 12. This result is obtained by activating the adhesive layer 20 and the separation layer 14.

If the electronics module 32 is thin enough relative to the thickness of the card, then the injection nozzle 64 may open out through the face 56 of the mold immediately opposite the electronics module. It is also possible to provide a plurality of injection nozzles. Injection nozzles may be placed in the side face 58 of the mold cavity, in which case the nozzles are preferably disposed in some of the "corners" of the mold cavity.

After opening the mold, the card body is unmolded including its electronics module 32 and the desired pattern 36 on its main face.

It will be understood that the support 12 performs two functions: it enables the pattern to be made; and it also ensures that the electronics module is accurately positioned relative to the mold cavity and thus relative to the card body. Furthermore, since the external tabs of the electronics module are glued to the support 12, they are protected from any possibility of the injected plastic material coming over them and covering them.

The support 12 which no longer bears the electronics module nor the pattern remains in the mold after the card has been removed.

Figure 5:
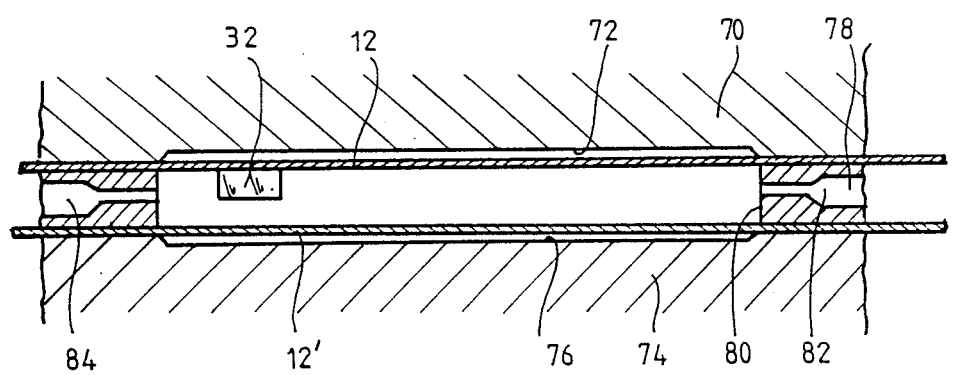
FIG. 5 is a vertical section through a second type of mold for manufacturing an electronics memory card.

FIG. 5 shows a variant mold for making an electronic memory card having graphics elements on both of its main faces. The mold comprises three portions. A moving first portion 70 includes the portion 72 of the mold cavity which defines the first main face of the card body.

A moving second portion 74 includes the portion 76 of the mold cavity which defines the second main face of the card body. A third portion 78 which is clamped between the moving portions 70 and 74 of the mold when the mold is closed includes the portion 80 of the mold cavity which defines the edge of the card body. The fixed portion 78 of the mold may include two injection nozzles 82 and 84, for example.

A card is manufactured using the mold of FIG. 5 as follows: the mold is opened, i.e. its moving portions 70 and 74 are moved away from the fixed portion 78. A film 12 supporting print elements and provided with an electronics module 32 is placed between the portions 70 and 78 of the mold as already described with reference to FIG. 3.

A second film 12' supporting print elements but not supporting an electronics module is placed in the same manner between the portions 78 and 74 of the mold. The mold is then closed by clamping means (not shown in FIG. 5). As a result, the films 12 and 12' are fixed to the mold since they are clamped between the three portions 70, 74, and 78 of the mold. Thereafter plastic material is injected into the mold via the nozzles 82 and 84, after which the card obtained in this way is unmolded.

In the above description, it is assumed that a pattern was required on at least one of the main faces of the card body. Naturally, a first object of the invention is to manufacture a memory card without any pattern. In this case, the sole function of the support film is to position and hold the electronics module inside the mold. The film is therefore devoid of any print elements. The support film must be made of a material which does not adhere to the injected material at the injection temperature, i.e. at a temperature of about 200° C. to 280° C. As the adhesive material used for fixing the electronics module on the support film, it must satisfy certain characteristics. It must retain its adhesive properties while the mold is being filled. It preferably loses its adhesive properties by a thermal effect while the molding material is cooling down. This ensures that the card is easily separated from the support film during unmolding. Optionally a chemical cleaning stage may follow during which the external contact tabs are cleaned in order to remove any residual traces of the adhesive material.

Figure 6:
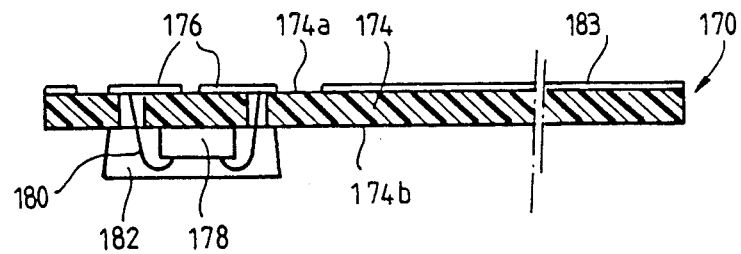
FIG. 6 is a vertical section through a support element provided with an electronics module suitable for a second implementation of the invention.
Figure 7:
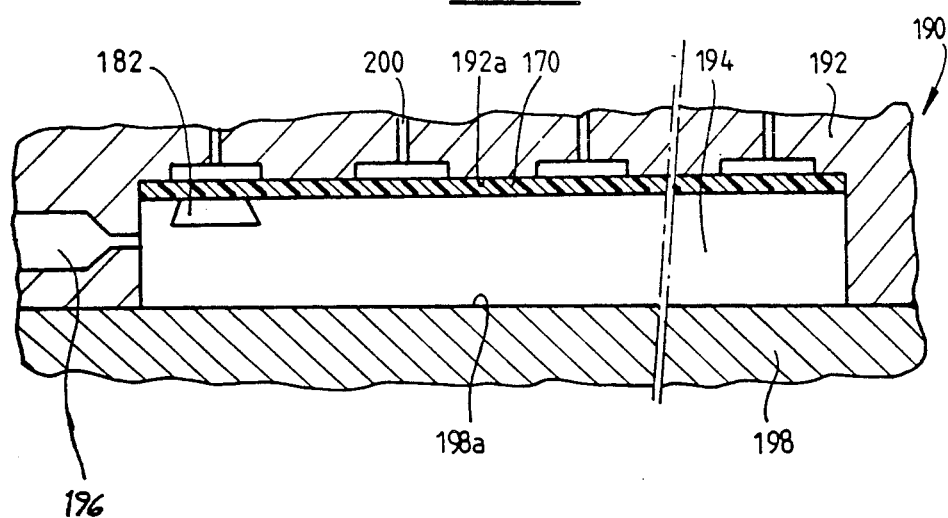
FIG. 7 is a vertical section through a mold for implementing a second implementation of the invention.

Reference is now made to FIGS. 6 and 7 for describing a second implementation of the invention.

FIG. 6 shows a support element 170. The support element 170 simultaneously constitutes the insulating support of the electronics module. The element 170 is constituted by a rectangular sheet 174, made of ABS, for example, and having the same shape as the main faces of the card to be made. In the appropriate zone, the sheet 174 includes metallization 176 on its outside face 174a for constituting the external electrical contact tabs of the card. A semiconductor chip 178 is fixed on the inside face 174b of the support 174 and connections 180 provide electrical interconnection between the terminals of the semiconductor chip 178 and the external tabs 176. The chip 178 and the connections 180 are preferably embedded in insulating material 182.

Prior to fixing the chip 178, graphics printing 183 may be performed on the outside face 174a of the sheet 174 in that portion of the sheet which is not occupied by the metallization 176.

FIG. 7 is a vertical section through a mold 190 suitable for making a card by means of the second implementation of the invention. The mold 190 includes a first portion 192 defining a cavity 194 whose shape corresponds to the outside shape of the card body to be made. Mold portion 192 includes a plurality of suction systems 200 opening out into the main face 192a of the cavity 194. Mold portion 192 also includes an injection channel 196 opening out into a "corner" of the cavity 194. The second portion 198 of the mold 190 defines the second main face 198a of the card body.

A memory card is manufactured in the second implementation of the invention as follows: the support element 170 together with the electronics module 180 is put into place against the face 192a of mold portion 192. The suction systems are switched on, thereby holding the element 170 firmly against the face 192a. The mold is then closed with the portion 198 being fixed to the portion 192. An appropriate plastic material is injected via the channel 196 and fills the cavity 194, thereby adherring to the inside face of the support element 170. The injected material is preferably the same as that used for making the support element 170.

The mold is then opened and the part obtained in this way is extracted. A memory card is thus made which optionally includes graphics elements on one of its main faces, which graphics elements were made prior to the card per se being made. This method also ensures that the electronics module 180 is very accurately positioned relative to the card body. In addition, it serves to obtain a pattern simultaneously with the support element then acting as a label.

I claim:

1. A method of manufacturing a memory card comprising a card body having two mutually parallel main faces and a memory module including an access face disposed in one of the main faces of the card body, comprising the steps of:
   providing a mold whose mold cavity defines the outside shape of said card and including two main walls for defining said two faces of the card body;
   providing a support element having two oppositely facing surfaces;
   providing a memory module having an access face;
   fixing the access face of said memory module to one of the surfaces of the support element;
   placing said support element in said mold such that its periphery is fixed to said mold with the memory module being in said mold cavity;
   injecting a plastic material into said mold so that the plastic material fills said mold cavity and presses the other of the surfaces of the support element against one of the two main walls of the mold cavity so that substantially the entirety of said memory module, except for its access face, is embedded in the plastic material; and
   unmolding the part obtained in this way, and forming one of said two main faces of the card body by separating the support element from said part, thereby causing said memory module to be inserted in the card body with said access face of the memory module being disposed in said one main face of the card body.

2. A method according to claim 1, further comprising the steps of applying print elements on said one surface of the support element on which the memory module is fixed, and such that said print elements adhere to a face of the volume of injected plastic material that comes into contact with said support element when the plastic material is injected into the mold, thereby providing a memory card which additionally includes graphics elements on said one main face of the card body.

3. A method according to claim 1, in which said memory module is an electronics module whose access face includes external electrical contact tabs.

4. A method according to claim 2, in which the print elements comprise graphics elements having two mutually parallel main faces, and wherein the applying step comprises fixing one of the main faces of the graphics elements to said support by means of a separation layer, and further comprising the step of covering the opposite face of the graphics elements with an adhesive material which is activated when hot so that said graphics elements can be separated from said support element and adhere to the plastic material.

5. A method according to claim 1, in which the plastic material is ABS.

6. A method of making an electronics memory card comprising a card body with two substantially parallel main faces, said method comprising the following steps:
 providing a mold whose mold cavity defines the outside shape of said card and including two main walls for defining said faces of the card body;
 providing a support element of insulating material having the shape of one of said main faces of the card body, and including two oppositely facing surfaces;
 fixing a semiconductor chip on one of the surfaces of said support element, providing external electrical contact tabs on the other surface of said support element, and electrically interconnecting said tabs and said chip;
 retaining said support element in said mold cavity;
 injecting a plastic material into said mold in such a manner that said external tabs are pressed against one of the walls of said mold cavity, and such that the material fills the said cavity so that substantially the entirety of said semiconductor chip is enclosed within the plastic material, and said support element adheres to that face of the volume of injected material which comes into contact therewith; and
 unmolding the part obtained in this way.

7. A method according to claim 6, in which said support element includes graphics elements on its surface supporting the external electrical contact tabs.

* * * * *